(12) United States Patent
Wu et al.

(10) Patent No.: US 12,283,516 B2
(45) Date of Patent: Apr. 22, 2025

(54) SEMICONDUCTOR DEVICE AND METHOD FOR MANUFACTURING THE SAME

(71) Applicant: CHANGXIN MEMORY TECHNOLOGIES, INC., Hefei (CN)

(72) Inventors: Gongyi Wu, Hefei (CN); Yong Lu, Hefei (CN); Youquan Yu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 719 days.

(21) Appl. No.: 17/447,239

(22) Filed: Sep. 9, 2021

(65) Prior Publication Data

US 2022/0051933 A1 Feb. 17, 2022

Related U.S. Application Data

(63) Continuation of application No. PCT/CN2021/096901, filed on May 28, 2021.

(30) Foreign Application Priority Data

Aug. 14, 2020 (CN) .......................... 202010816737.6

(51) Int. Cl.
*H01L 21/762* (2006.01)
*H01L 21/3105* (2006.01)
(Continued)

(52) U.S. Cl.
CPC .. *H01L 21/76229* (2013.01); *H01L 21/31053* (2013.01); *H01L 21/7681* (2013.01); *H10D 62/115* (2025.01)

(58) Field of Classification Search
CPC ......... H01L 21/76229; H01L 21/76224; H01L 21/7681; H01L 21/31023; H01L 29/06469;
(Continued)

(56) References Cited

U.S. PATENT DOCUMENTS

| 8,383,515 B2 | 2/2013 | Luoh |
| 9,064,801 B1 | 6/2015 | Horak et al. |
| 2012/0122296 A1 | 5/2012 | Luoh |

FOREIGN PATENT DOCUMENTS

| CN | 101207064 A | 6/2008 |
| CN | 103681784 A | 3/2014 |

(Continued)

*Primary Examiner* — Karen Kusumakar
(74) *Attorney, Agent, or Firm* — SYNCODA LLC; Feng Ma

(57) ABSTRACT

A semiconductor device manufacturing method includes: providing a semiconductor substrate, wherein the semiconductor substrate includes an array region and a peripheral region; word line structures and shallow trench isolation structures are formed in the array region, grooves are formed over word line structures, and a shallow trench isolation structure is formed in the peripheral region; depositing at least two insulating layers on a surface of the semiconductor substrate, each of the insulating layer has a different etch rate under a same etching condition; and removing part of the insulating layers located on surfaces of the array region and the peripheral region in sequence, wherein a lower insulating layer in the adjacent insulating layers is an etch stop layer of an upper insulating layer, and keeping all the insulating layers in the grooves located over the word line structures.

8 Claims, 15 Drawing Sheets

(51) Int. Cl.
*H01L 21/768* (2006.01)
*H01L 29/06* (2006.01)
*H10D 62/10* (2025.01)

(58) Field of Classification Search
CPC .......... H01L 21/31053; H01L 29/0649; H10B 12/50; H10B 12/34
See application file for complete search history.

(56) References Cited

FOREIGN PATENT DOCUMENTS

| | | | |
|---|---|---|---|
| CN | 105448840 | A | 3/2016 |
| CN | 106206585 | A | 12/2016 |
| CN | 108899309 | * | 6/2018 |
| CN | 207868200 | U | 9/2018 |
| CN | 108899309 | A | 11/2018 |
| CN | 110610940 | A | 12/2019 |

* cited by examiner

Providing a semiconductor substrate, where the semiconductor substrate includes an array region and a peripheral region, word line structures and shallow trench isolation structures are formed in the array region, grooves are formed over word line structures, and a shallow trench isolation structure is formed in the peripheral region Depositing at least two insulating layers on a surface of the semiconductor substrate, each of the insulating layer has a different etch rate under a same etching condition Removing part of the insulating layers located on surfaces of the array region and the peripheral region in sequence, where the lower insulating layer in the adjacent insulating layers is an etch stop layer of the upper insulating layer, and preserving all the insulating layers in the grooves located over the word line structures

FIG. 1

SEMICONDUCTOR DEVICE AND METHOD FOR MANUFACTURING THE SAME

CROSS-REFERENCE TO RELATED APPLICATIONS

This is a continuation of International Patent Application No. PCT/CN2021/096901 filed on May 28, 2021, which claims priority to Chinese Patent Application No. 202010816737.6 filed on Aug. 14, 2020. The disclosures of these applications are hereby incorporated by reference in their entirety.

BACKGROUND

In a semiconductor device in the prior art, the performance of a Shallow Trench Isolation (STI) structure is critical to the performance and yield of the final semiconductor device. As the critical dimension of semiconductor devices is decreased to the 28 nm node and below, it becomes more and more difficult to control the profile of the STI structure. For example, when a buried Word Line (WL) structure is subsequently formed, the traditional dry etching and wet cleaning will damage the STI structure, and may cause the height of the STI structure in a peripheral region to be lower than that of a substrate, which will cause defects such as a leakage at an edge of the STI, and reduce the reliability of the semiconductor device, and further cause the loss of the yield and performance of the final device.

SUMMARY

This application relates generally to the technical field of semiconductors, and more specifically to a semiconductor device and a method for manufacturing the same.

The present disclosure provides a method for manufacturing a semiconductor device, which can reduce the damage to a STI structure, and improve the performance and yield of the semiconductor device.

The present disclosure provides a method for manufacturing a semiconductor device, the method including: providing a semiconductor substrate, wherein the semiconductor substrate includes an array region and a peripheral region, WL structures and STI structures are formed in the array region, grooves are formed over a WL structure, and a STI structure is formed in the peripheral region; depositing at least two insulating layers on a surface of the semiconductor substrate, each of the insulating layer has a different etch rate under a same etching condition; and removing part of the insulating layers located on surfaces of the array region and the peripheral region in sequence, wherein the lower insulating layer in the adjacent insulating layers is an etch stop layer of the upper insulating layer, and preserving all the insulating layers in the grooves located over the WL structures.

According to one or more embodiments of the present disclosure, a patterned mask layer is formed over the semiconductor substrate, and the mask layer covers a surface of the STI structure. The grooves over the WL structures are exposed from the mask layer.

According to one or more embodiments of the present disclosure, the depositing at least two insulating layers on a surface of the semiconductor substrate includes the following steps: depositing a first insulating layer on a surface of the patterned mask layer and in the grooves over the WL structures; depositing a second insulating layer on a surface of the first insulating layer; and depositing a third insulating layer on a surface of the second insulating layer, the first insulating layer, the second insulating layer, and the third insulating layer filling up the grooves over the WL structures.

According to one or more embodiments of the present disclosure, the step of removing part of the insulating layers located on surfaces of the array region and the peripheral region in sequence includes: removing a part of the third insulating layer located over the second insulating layer, the second insulating layer being formed as an etch stop layer of the third insulating layer; removing a part of the second insulating layer located over the first insulating layer, the first insulating layer being an etch stop layer of the second insulating layer; and removing a part of the first insulating layer located over the mask layer, and the first insulating layer, the second insulating layer, and the third insulating layer located over the grooves, and preserving the first insulating layer, the second insulating layer, and the third insulating layer located in the grooves.

According to one or more embodiments of the present disclosure, after part of the insulating layers located on surfaces of the array region and the peripheral region are removed in sequence, the mask layer over the semiconductor substrate is removed.

According to one or more embodiments of the present disclosure, the mask layer and the first insulating layer have different etch rates under a same etching condition.

According to one or more embodiments of the present disclosure, an etch selectivity a of the first insulating layer to the second insulating layer under a same etching condition satisfies: $2<a\leq3$, and an etch selectivity b of the second insulating layer to the third insulating layer under a same etching condition satisfies: $2<b\leq5$.

According to one or more embodiments of the present disclosure, a thickness of the first insulating layer ranges from 3 nm to 6 nm, a thickness of the second insulating layer ranges from 10 nm to 20 nm, and a thickness of the third insulating layer ranges from 10 nm to 20 nm.

The present disclosure also provides a semiconductor device, including: a semiconductor substrate, having an array region and a peripheral region formed therein, wherein, WL structures and STI structures are formed in the array region; grooves are formed over a WL structure; and an insulating structure, including at least two insulating layers which are stacked and fill up the grooves over the WL structures, the lower insulating layer in the adjacent insulating layers wrapping the upper insulating layer; and a STI structure is formed in the peripheral region.

According to one or more embodiments of the present disclosure, a surface of the insulating layer filled in the groove over the WL structure is flush with a surface of the semiconductor substrate.

According to one or more embodiments of the present disclosure, surfaces of the STI structures in the array region and the peripheral region are flush with a surface of the semiconductor substrate.

BRIEF DESCRIPTION OF THE DRAWINGS

FIG. 1 is a flowchart of a method for manufacturing a semiconductor device according to embodiments of the present disclosure.

DETAILED DESCRIPTION

Figure 2:
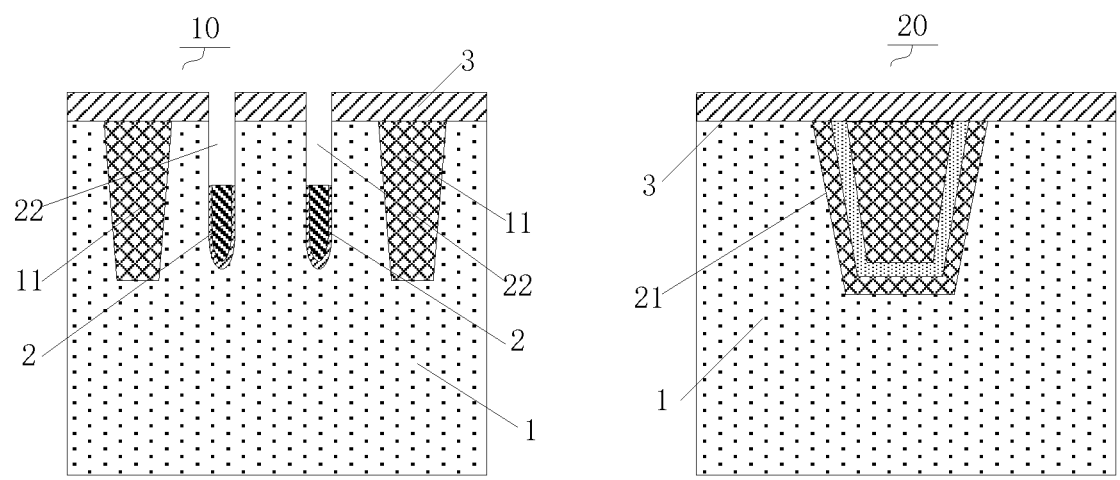
FIG. 2 is a first schematic structural diagram of a step of a method for manufacturing a semiconductor device according to an embodiment of the present disclosure.

The following further describes a semiconductor device and a method for manufacturing the same provided by the present disclosure in detail with reference to the accompanying drawings and specific implementations.

The following describes a method for manufacturing a semiconductor device 100 according to embodiments of the present disclosure with reference to the accompanying drawings.

As shown in FIG. 1, a method for manufacturing a semiconductor device 100 according to embodiments of the present disclosure includes the following steps. A semiconductor substrate 1 is provided. The semiconductor substrate 1 includes an array region 10 and a peripheral region 20. WL structures 2 and STI structures 11 are formed in the array region 10. Grooves 22 are formed over the WL structures 2. A STI structure 21 is formed in the peripheral region 20. At least two insulating layers are deposited on a surface of the semiconductor substrate 1. Etch rates of the insulating layers are different under a same etching condition. Part of the insulating layers located on surfaces of the array region 10 and the peripheral region 20 are removed in sequence. The lower insulating layer in the adjacent insulating layers is an etch stop layer of the upper insulating layer. All the insulating layers in the grooves 22 located over the WL structures are preserved.

Figure 7:
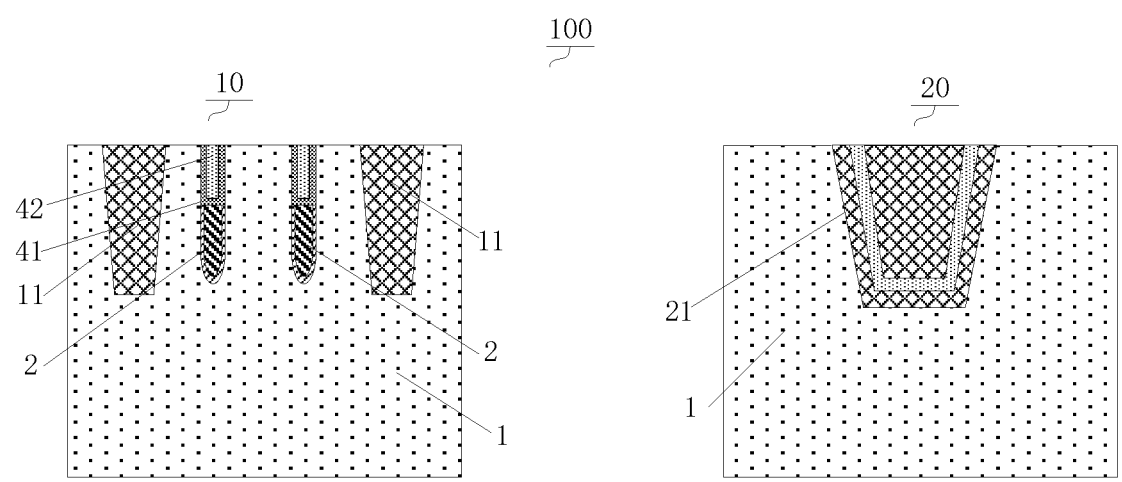
FIG. 7 is a sixth schematic structural diagram of a step of a method for manufacturing a semiconductor device according to an embodiment of the present disclosure.
Figure 8:
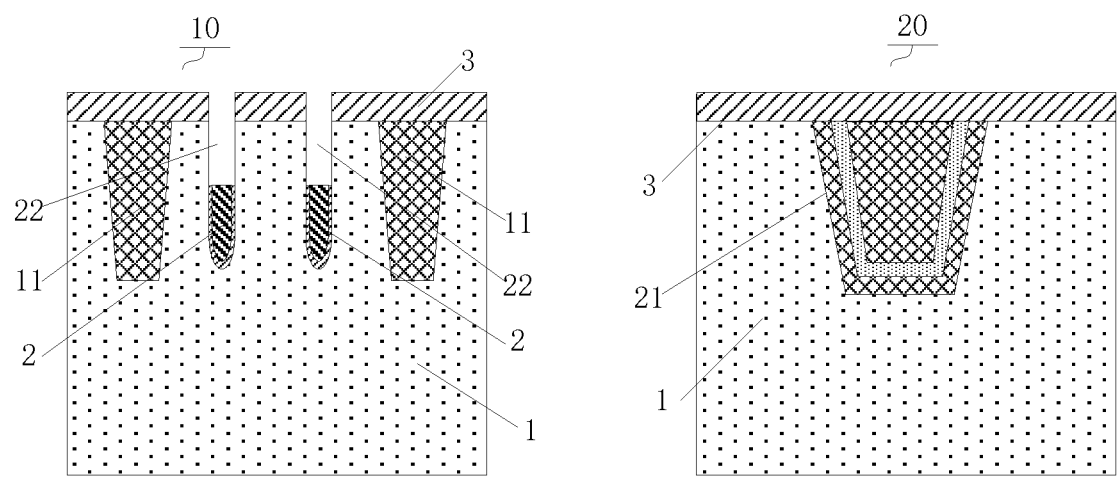
FIG. 8 is a first schematic structural diagram of a step of a method for manufacturing a semiconductor device according to another embodiment of the present disclosure.

As shown in FIG. 2 and FIG. 8, a semiconductor substrate 1 can include an array region 10 and a peripheral region 20. In FIG. 2 to FIG. 15, the drawings on the left are schematic structural diagrams of an array region 10, and the drawings on the right are schematic structural diagrams of a peripheral region 20. The semiconductor device 1 can be made of any material suitable for forming a semiconductor device 100. For example, the semiconductor substrate 1 can be made of silicon, germanium or silicon on insulator, etc., which can be selected according to actual conditions.

As shown in FIG. 2 and FIG. 8, WL structures 2 and STI structures 11 are formed in the array region 10. The WL structures 2 are formed in the semiconductor substrate 1. Grooves 22 exposing the WL structures 2 are formed over the WL structures 2. A STI structure 21 is formed in the peripheral region 20. Both the STI structures 11 in the array region 10 and the STI structure 21 in the peripheral region 20 are formed in the semiconductor substrate 1 and are flush with a surface of the semiconductor substrate 1. The STI structure includes shallow trenches (STs) and dielectric materials filled therein. The dielectric material can be used for isolating ST leakage and reducing electrical coupling, and can be a silicon oxide material, etc.

Optionally, as shown in FIG. 2 and FIG. 8, a patterned mask layer 3 can be formed over the semiconductor substrate 1, and covers the STI structures 11 in the array region 10 and the STI structure 21 in the peripheral region 20, such that the grooves 22 over the WL structures 2 are exposed from the mask layer 3. The mask layer 3 is a pattern used for defining the etching of the semiconductor substrate 1, and can be a mask layer used for patterning the semiconductor substrate 1 to form the grooves 22 and WL grooves for accommodating the WL structures 2. The mask layer 3 exposes the grooves 22 and the WL structures 2, so as to fill WL insulating structures in the grooves 22. Moreover, when the insulating layers are subsequently formed by deposition, the semiconductor substrate 1 and the STI structures can also be isolated from the insulating layers through the mask layer 3, so as to reduce the damages to the semiconductor substrate 1, the STI structures 11, and the STI structure 21 caused by etching during the subsequent etching of the insulating layers. The mask layer 3 can be a hard mask layer, and can be made of silicon oxide or silicon nitride.

At least two insulating layers are deposited on a surface of the semiconductor substrate 1. In other words, two or more insulating layers can be deposited on the semiconductor substrate 1. For example, three or four insulating layers, etc. can be deposited. The at least two insulating layers are stacked. The lower insulating layer wraps the upper insulating layer. The at least two insulating layers fill up the grooves 22. Etch rates of the insulating layers are different under a same etching condition. That is, the insulating layers are made of different insulating materials. The at least two insulating layers have an etch selectivity under the same condition. The insulating layer can be made of one or more of silicon oxide, silicon nitride, silicon oxynitride, etc.

Part of the insulating layers located on surfaces of the array region 10 and the peripheral region 20 are removed in sequence. All the insulating layers in the grooves 22 located over the WL structures 2 are preserved. That is, all the insulating layers are sequentially etched in steps from top to bottom. Part of the insulating layers located on the surface of the mask layer 3 are removed. The insulating layers located over the WL structures 2 and in the grooves 22 are preserved to form the WL insulating structures. The lower insulating layer in the adjacent insulating layers is an etch stop layer of the upper insulating layer. That is, two adjacent insulating layers are made of different insulating materials. When the insulating layer located over is etched, the lower insulating layer is formed as an etch stop layer of the upper insulating layer, so as to reduce the influence of overetching and protect the STI structures. Moreover, a plurality of insulating layers are deposited, such that the thickness of each of the insulating layers is relatively small, the etching time when the insulating layers are etched is shortened, and the influence of overetching can be further reduced.

The following describes a method for manufacturing a semiconductor device 100 according to one embodiment of the present disclosure with reference to FIG. 2 to FIG. 7.

As shown in FIG. 2, a semiconductor substrate 1 is provided. A mask layer 3 is formed over the semiconductor substrate 1, covers surfaces of an array region 10 and a peripheral region 20, and exposes grooves 22 over WL structures 2.

Figure 3:
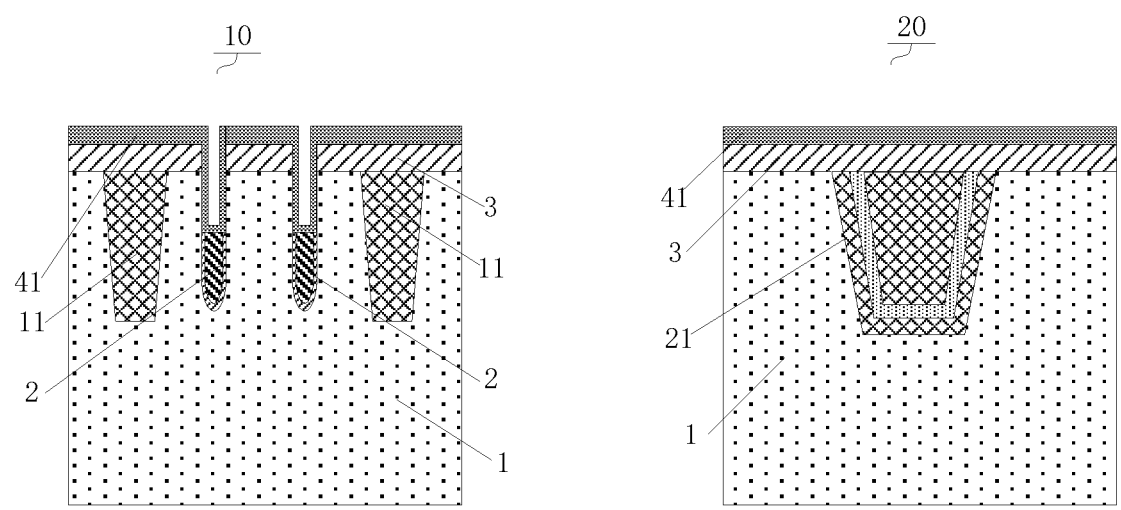
FIG. 3 is a second schematic structural diagram of a step of a method for manufacturing a semiconductor device according to an embodiment of the present disclosure.
Figure 4:
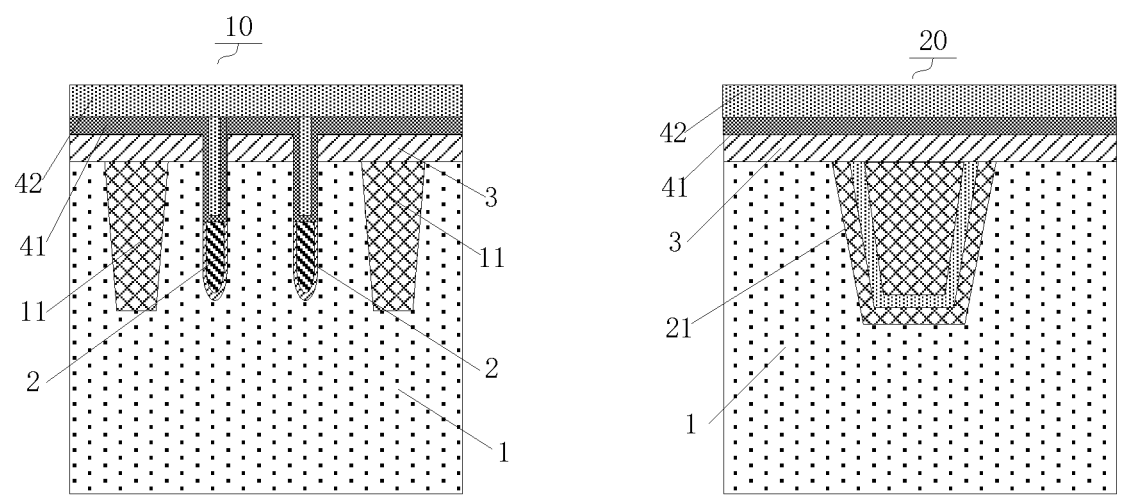
FIG. 4 is a third schematic structural diagram of a step of a method for manufacturing a semiconductor device according to an embodiment of the present disclosure.

As shown in FIG. 3 and FIG. 4, two insulating layers, i.e., a first insulating layer 41 and a second insulating layer 42, are deposited on a surface of a semiconductor substrate 1. The specific steps are as follows: as shown in FIG. 3, the first insulating layer 41 is deposited on a surface of a patterned mask layer 3 and in grooves 22 over WL structures, covers a surface of the mask layer 3 and inner wall surfaces of the grooves 22 over the WL structures 2. As shown in FIG. 4, the second insulating layer 42 is deposited on a surface of the first insulating layer 41, covers the surface of the first insulating layer 41, and fills grooves 22 over WL structures 2 together with the second insulating layer 42. A part of the first insulating layer 41 located in the groove 22 wraps a part of the second insulating layer 42 located in the groove 22. The part of the first insulating layer 41 located in the groove 22 and the part of the second insulating layer 42 located in the groove 22 can be used for isolating the WL structures 2.

The first insulating layer 41 and the second insulating layer 42 can be formed by an Atomic Layer Deposition (ALD) method or a Chemical Vapor Deposition (CVD) method. Furthermore, the first insulating layer 41 can be formed by an ALD method, and the second insulating layer 42 can be formed by a CVD method. The first insulating layer 41 is the bottommost insulating layer. The use of the ALD method can make the formed first insulating layer 41 more dense, such that the overetching damage to a STI structure can be further reduced during etching.

The first insulating layer 41 can be made of silicon nitride (SiN), nitrogen silicon carbide (SiCN), or boron-containing silicon nitride (SiBN) or silicon carbon oxynitride (Si-$O_xC_yN_z$). The second insulating layer 42 can be made of silicon oxide ($SiO_2$), silicon oxynitride (SiON), or boron-containing silicon nitride (SiBN) or silicon carbon oxynitride ($SiO_xC_yN_z$). The first insulating layer 41 and the second insulating layer 42 are made of different materials, which can be selected according to actual conditions. The first insulating layer 41 and the second insulating layer 42 are made of different materials, and have different etch rates. For example, the first insulating layer 41 can be made of silicon nitride, and the second insulating layer 42 can be made of silicon oxynitride. Optionally, an etch selectivity a of the first insulating layer 41 to the second insulating layer 42 under a same etching condition satisfies: $2 < a \leq 3$.

Optionally, the thickness of the first insulating layer 41 is different from that of the second insulating layer 42. The thickness of the first insulating layer 41 is less than that of the second insulating layer 42. For example, a thickness of the first insulating layer 41 ranges from 3 nm to 6 nm, and a thickness of the second insulating layer 42 ranges from 20 nm to 40 nm. In this way, it can be ensured that the first insulating layer 41 and the second insulating layer 42 fill the grooves 22 over the WL structures 2, and the first insulating layer 41 can as well block the etching of the second insulating layer 42 during the subsequent etching process. In addition, since the first insulating layer 41 has a small thickness, and the etching time of the first insulating layer 41 is short, it is easy to control to reduce the damage to a mask layer 3 during the subsequent etching process.

Figure 5:
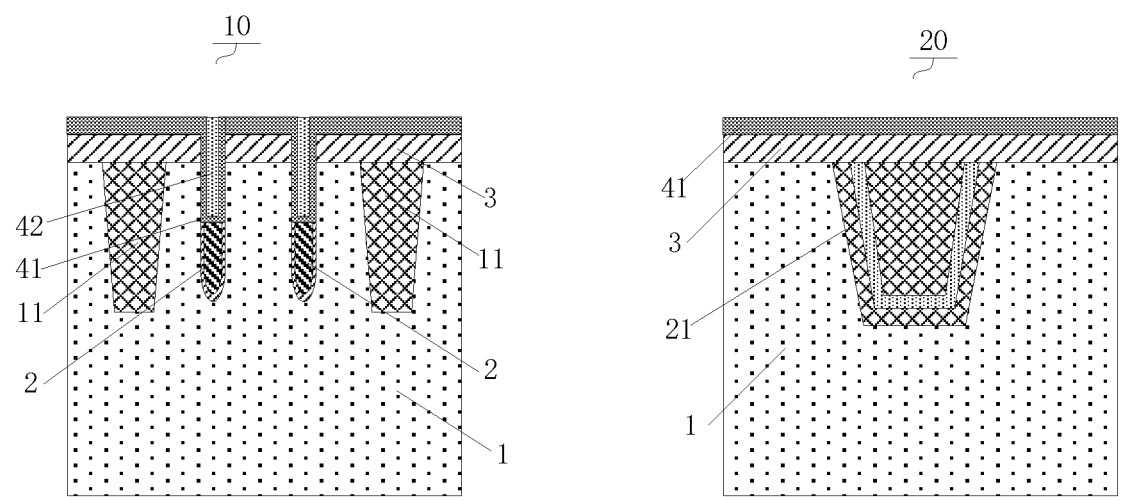
FIG. 5 is a fourth schematic structural diagram of a step of a method for manufacturing a semiconductor device according to an embodiment of the present disclosure.

As shown in FIG. 5, a part of the second insulating layer 42 located over a first insulating layer 41 is removed. The first insulating layer 41 is formed as an etch stop layer of the second insulating layer 42. A part of the second insulating layer 42 can be removed by dry etching. When the second insulating layer 42 located in a peripheral region 20 is removed, a part of the second insulating layer 42 located on a surface of an array region 10 will remain, and then the remaining second insulating layer 42 in the array region 10 can be removed by controlling the etching time. The first insulating layer 41 in the peripheral region 20 is formed as a stop layer of the second insulating layer 42. Therefore, the influence of overetching on a STI structure 21 in the peripheral region 20 can be reduced.

Figure 6:
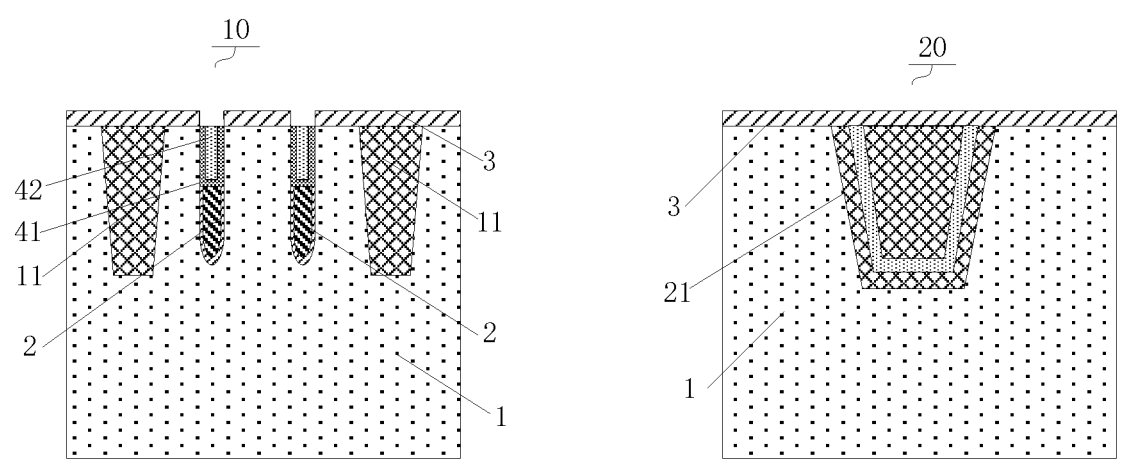
FIG. 6 is a fifth schematic structural diagram of a step of a method for manufacturing a semiconductor device according to an embodiment of the present disclosure.

As shown in FIG. 6, a part of the first insulating layer 41 located over a mask layer 3, and the first insulating layer 41 and a second insulating layer 42 located over grooves 22 are removed. The first insulating layer 41 and the second insulating layer 42 located in the grooves 22 are preserved. The first insulating layer 41 on surfaces of a peripheral region 20 and an array region 10 can be removed by dry etching. Since the first insulating layer 41 and the mask layer 3 are made of different materials, the mask layer 3 can be formed as an etch stop layer, such that the influence of overetching can be further reduced to avoid damaging STI structures 21 in the peripheral region 20.

As shown in FIG. 7, a mask layer 3 located over a semiconductor substrate 1 is removed. The mask layer 3 is removed by wet etching. Since the thickness of the mask layer 3 in an array region 10 is approximate to the thickness of the mask layer 3 in a peripheral region 20, the damage to STI structures 21 in the peripheral region 20 can be avoided during wet etching.

The following describes a method for manufacturing a semiconductor device 100 according to the other embodiment of the present disclosure with reference to FIG. 8 to FIG. 15.

As shown in FIG. 8, a semiconductor substrate 1 is provided. A mask layer 3 is formed over the semiconductor substrate 1, covers surfaces of an array region 10 and a peripheral region 20, and exposes grooves 22 over WL structures 2.

Figure 9:
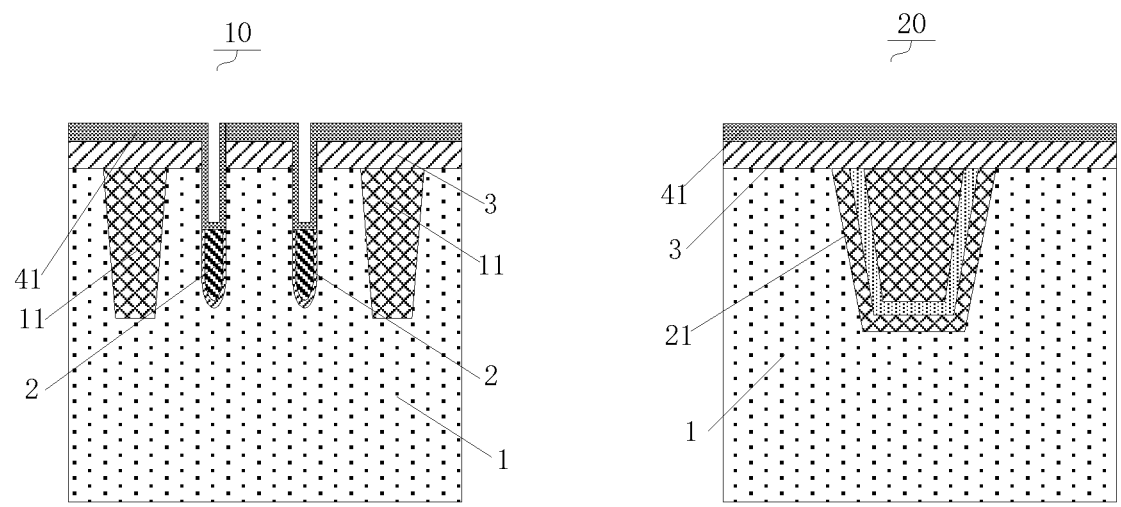
FIG. 9 is a second schematic structural diagram of a step of a method for manufacturing a semiconductor device according to another embodiment of the present disclosure.
Figure 10:
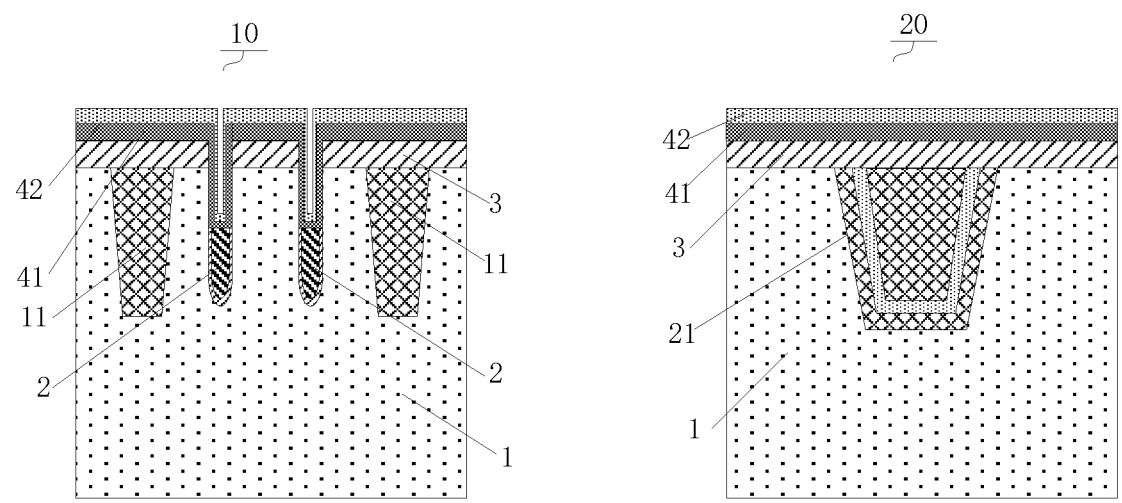
FIG. 10 is a third schematic structural diagram of a step of a method for manufacturing a semiconductor device according to another embodiment of the present disclosure.
Figure 11:
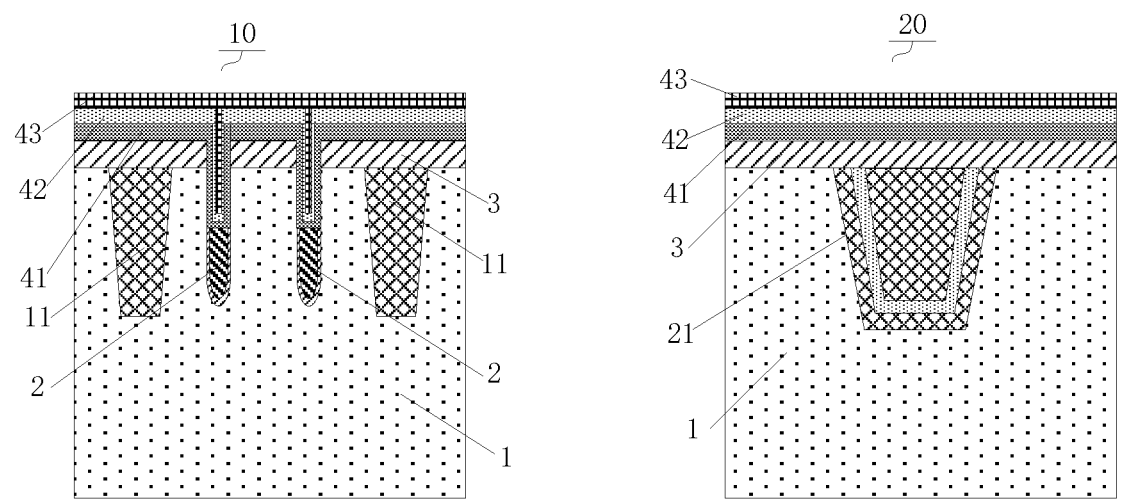
FIG. 11 is a fourth schematic structural diagram of a step of a method for manufacturing a semiconductor device according to another embodiment of the present disclosure.

As shown in FIG. 9 to FIG. 11, three insulating layers, i.e., a first insulating layer 41, a second insulating layer 42, and a third insulating layer 43, are deposited on a surface of a semiconductor substrate 1. The specific steps are as follows: as shown in FIG. 9, a first insulating layer 41 is deposited on a surface of a patterned mask layer 3 and in grooves 22 over WL structures 2, covers the surface of the mask layer 3 and inner wall surfaces of the grooves 22 over the WL structures 2. As shown in FIG. 10, a second insulating layer 42 is deposited on a surface of a first insulating layer 41. As shown in FIG. 11, a third insulating layer 43 is deposited on a surface of a second insulating layer 42. A first insulating layer 41, the second insulating layer 42, and the third insulating layer 43 fill grooves 22 over WL structures 2. A part of the first insulating layer 41 located in the groove 22 wraps a part of the second insulating layer 42 located in the groove 22. The part of the second insulating layer 42 located in the groove 22 wraps a part of the third insulating layer 43 located in the groove 22. The part of the first insulating layer 41 located in the groove 22, the part of the second insulating layer 42 located in the groove 22, and the third insulating layer 43 located in the groove 22 are used for isolating the WL structures 2.

The first insulating layer 41, the second insulating layer 42, and the third insulating layer 43 can be formed by an ALD method or a CVD method. For example, the first insulating layer 41 can be formed by an ALD method, the second insulating layer 42 can be formed by a plasma-enhanced CVD method, and the third insulating layer 43 can be formed by a CVD method, such that the lower insulating layer is more dense than the upper insulating layer, and the influence of overetching on the lower insulating layer can be further reduced when the upper insulating layer is etched.

The insulating layers can be made of silicon nitride (SiN), nitrogen silicon carbide (SiCN), or boron-containing silicon nitride (SiBN) or silicon carbon oxynitride ($SiO_xC_yN_z$), etc. The insulating layers are made of different materials, which can be specifically selected according to actual conditions. The insulating layers have different etch rates. For example, the first insulating layer 41 can be made of silicon nitride, the second insulating layer 42 can be made of silicon oxynitride, and the third insulating layer 43 can be made of nitrogen silicon carbide (SiCN). Optionally, an etch selectivity a of the first insulating layer 41 to the second insulating layer 42 under a same etching condition satisfies: $2<a\leq3$, and an etch selectivity b of the second insulating layer 42 to the third insulating layer 43 under a same etching condition satisfies: $2<b\leq5$. In this way, the influence of overetching on the lower insulating layer can be further reduced when the insulating layer is etched.

Figure 12:
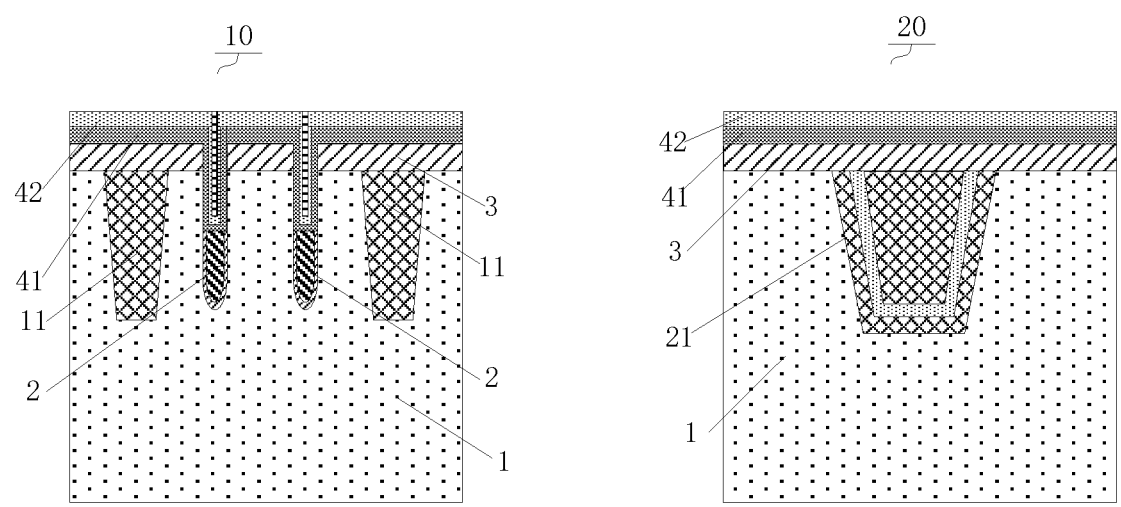
FIG. 12 is a fifth schematic structural diagram of a step of a method for manufacturing a semiconductor device according to another embodiment of the present disclosure.
Figure 13:
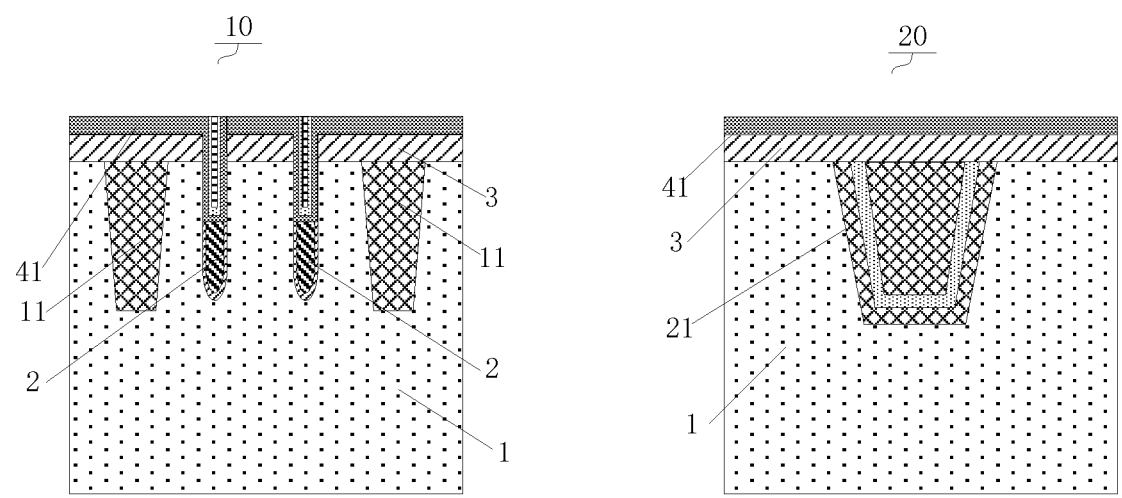
FIG. 13 is a sixth schematic structural diagram of a step of a method for manufacturing a semiconductor device according to another embodiment of the present disclosure.
Figure 14:
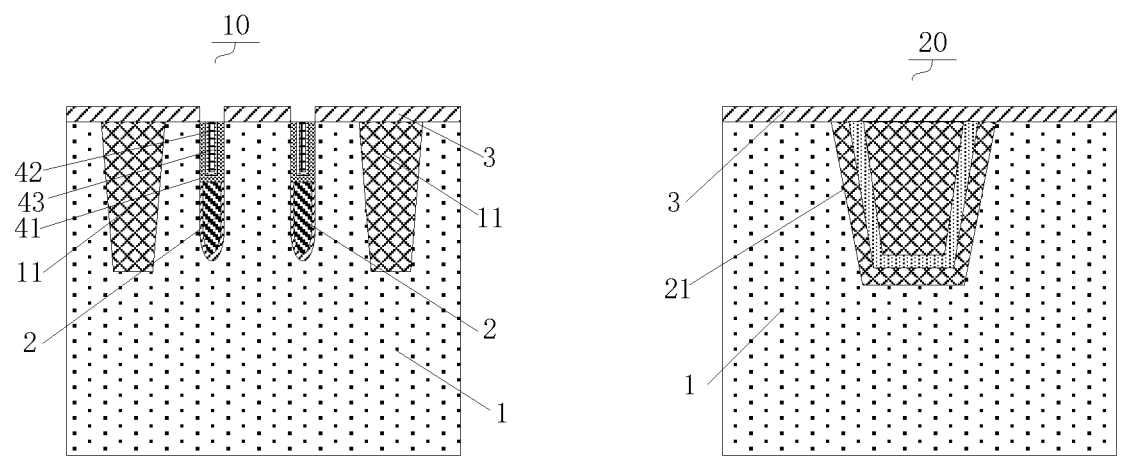
FIG. 14 is a seventh schematic structural diagram of a step of a method for manufacturing a semiconductor device according to another embodiment of the present disclosure.

Optionally, the thickness of the first insulating layer 41 is different from that of the second insulating layer 42 and that of the third insulating layer 43. For example, a thickness of the first insulating layer 41 ranges from 3 nm to 6 nm, a thickness of the second insulating layer 42 ranges from 10 nm to 20 nm, and a thickness of the third insulating layer 43 ranges from 10 nm to 20 nm. In this way, it can be ensured that the first insulating layer 41, the second insulating layer 42, and the third insulating layer 43 fill grooves 22 over WL structures 2, and the second insulating layer 42 can well block the etching of the third insulating layer 43, and the first insulating layer 41 can well block the etching of the second insulating layer 42 during the subsequent etching process. In addition, since the first insulating layer 41 has a small thickness, and the etching time of the first insulating layer 41 is short, it is easy to control to reduce the damage to a mask layer 3 during the subsequent etching process. As shown in FIG. 12, a part of the third insulating layer 43 located over a second insulating layer 42 is removed, and the second insulating layer 42 is formed as an etch stop layer of a third insulating layer 43. As shown in FIG. 13, a part of the second insulating layer 42 located over a first insulating layer 41 is removed, and the first insulating layer 41 is formed as an etch stop layer of the second insulating layer 42. As shown in FIG. 14, a part of the first insulating layer 41 located over a mask layer 3, and the first insulating layer 41, the second insulating layer 42, and the third insulating layer 43 located over grooves 22 are removed. The first insulating layer 41, the second insulating layer 42, and the third insulating layer 43 located in the grooves 22 are preserved. Since the first insulating layer 41 and the mask layer 3 are made of different materials, the mask layer 3 can be formed as an etch stop layer of the first insulating layer 41, such that the influence of overetching can be further reduced to avoid damaging STI structures 21 in a peripheral region 20.

Figure 15:
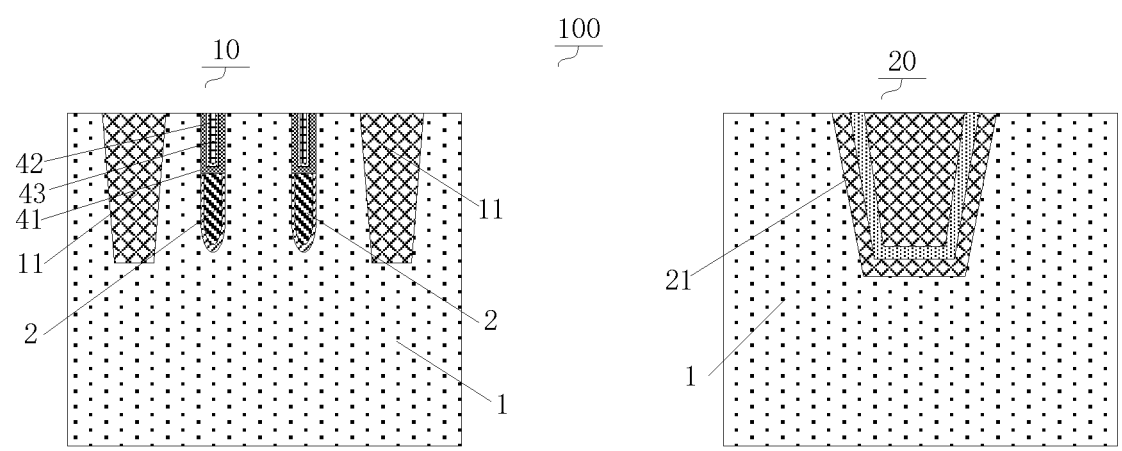
FIG. 15 is an eighth schematic structural diagram of a step of a method for manufacturing a semiconductor device according to another embodiment of the present disclosure.

As shown in FIG. 15, a mask layer 3 located over a semiconductor substrate 1 is removed by wet etching. Since the thickness of the mask layer 3 in an array region 10 is approximate to the thickness of the mask layer 3 in a peripheral region 20, damage to the STI structures 21 in the peripheral region 20 can be avoided during wet etching.

The present disclosure also provides a semiconductor device 100, which can be formed by the method for manufacturing the semiconductor device 100.

As shown in FIG. 7 and FIG. 15, a semiconductor device 100 according to embodiments of the present disclosure can include a semiconductor substrate 1 and an insulating structure. An array region 10 and a peripheral region 20 are formed in the semiconductor substrate 1. WL structures 2 and STI structures 11 are formed in the array region 10. Grooves 22 are formed over the WL structures 2. A STI structure 21 is formed in the peripheral region 20.

The insulating structure includes at least two insulating layers, which are stacked and fill up the grooves 22 over the WL structures 2. In adjacent insulating layers, the lower insulating layer wraps the upper insulating layer. The insulating structure is used for isolating the WL structures 2. In an example shown in FIG. 7, an insulating structure can include a first insulating layer 41 and a second insulating layer 42 which are stacked. The first insulating layer 41 covers inner wall surfaces of grooves 22. The second insulating layer 42 is formed on a surface of the first insulating layer 41, and fills up the grooves 22 together with the first insulating layer 41. The first insulating layer 41 wraps the second insulating layer 42. The first insulating layer 41 and the second insulating layer 42 are made of different materials.

As shown in FIG. 15, an insulating structure can include a first insulating layer 41, a second insulating layer 42, and a third insulating layer 43 which are stacked. The first insulating layer 41 covers inner wall surfaces of grooves 22. The second insulating layer 42 is formed on a surface of the first insulating layer 41. The first insulating layer 41 wraps the second insulating layer 42. The third insulating layer 43 is formed in the second insulating layer 42. The second insulating layer 42 wraps the third insulating layer 43. The first insulating layer 41, the second insulating layer 42, and the third insulating layer 43 fill up the grooves 22, and are made of different materials, so as to improve the insulating effect. Moreover, since the first insulating layer 41, the second insulating layer 42, and the third insulating layer 43 are made of different materials during the formation process of the insulating structure, and have different etch rates, the influence of overetching can also be reduced during etching to avoid damaging STI structures.

Surfaces of the insulating layers filled in the grooves 22 over WL structures 2 are flush with a surface of a semiconductor substrate 1. That is, an upper surface of an insulating structure in the groove 22 is flush with an upper surface of the semiconductor substrate 1. As shown in FIG. 7, upper surfaces of a first insulating layer 41 and a second insulating layer 42 are flush with each other, and are flush with a surface of a semiconductor substrate 1. As shown in FIG. 15, upper surfaces of a first insulating layer 41, a second insulating layer 42, and a third insulating layer 43 are flush with each other, and are flush with a surface of a semiconductor substrate 1.

Surfaces of STI structures 11 in an array region 10 and a STI structure 21 in a peripheral region 20 are flush with a surface of a semiconductor substrate 1. Therefore, a leakage at an edge of the STI structure 21 can be avoided, the reliability of a semiconductor device 100 can be improved, and thus the loss of the yield and performance of the semiconductor device 100 is reduced.

The foregoing descriptions are merely optional implementations of the present disclosure. A person of ordinary skill in the art may further make several improvements and modifications without departing from the principle of the present disclosure, and the improvements and modifications fall within the protection scope of the present disclosure.

What is claimed is:

1. A method for manufacturing a semiconductor device, comprising:
   providing a semiconductor substrate, wherein the semiconductor substrate comprises an array region and a peripheral region, word line structures and first shallow trench isolation structures are formed in the array region, grooves are formed over the word line structures, and a second shallow trench isolation structure is formed in the peripheral region;
   forming a patterned mask layer over the semiconductor substrate, wherein the mask layer covers surfaces of the first shallow trench isolation structures and the second shallow trench isolation structure, and the grooves over the word line structures are exposed from the mask layer;
   depositing at least two insulating layers on a surface of the semiconductor substrate, and the at least two insulating layers having different etching rates under a same etching condition;
   removing a part of the at least two insulating layers located on surfaces of the array region and the peripheral region sequentially, wherein a lower insulating layer is an etching stop layer of an upper insulating layer between the two adjacent insulating layers, and retaining all the at least two insulating layers in the grooves located over the word line structures;
   wherein the depositing the at least two insulating layers on the surface of the semiconductor substrate comprises the following steps:
   depositing a first insulating layer on a surface of the patterned mask layer and in the grooves over the word line structures;
   depositing a second insulating layer on a surface of the first insulating layer; and
   depositing a third insulating layer on a surface of the second insulating layer the first insulating layer, the second insulating layer, and the third insulating layer filling in the grooves over the word line structures.

2. The method for manufacturing a semiconductor device of claim 1, wherein the removing the part of the insulating layers located on the surfaces of the array region and the peripheral region sequentially comprises:
   removing a part of the third insulating layer located over the second insulating layer, the second insulating layer being formed as an etching stop layer of the third insulating layer;
   removing a part of the second insulating layer located over the first insulating layer, the first insulating layer being an etching stop layer of the second insulating layer; and
   removing a part of the first insulating layer located over the mask layer, and the first insulating layer, the second insulating layer, and the third insulating layer located over the grooves, and retaining the first insulating layer, the second insulating layer, and the third insulating layer located in the grooves.

3. The method for manufacturing a semiconductor device of claim 2, wherein after the part of the insulating layers located on the surfaces of the array region and the peripheral region are sequentially removed, the mask layer located over the semiconductor substrate is removed.

4. The method for manufacturing a semiconductor device of claim 1, wherein the mask layer and the first insulating layer have different etching rates under a same etching condition.

5. The method for manufacturing a semiconductor device of claim 1, wherein an etching selectivity a of the first insulating layer to the second insulating layer under a same etching condition satisfies: $2<a\leq3$, and an etching selectivity b of the second insulating layer to the third insulating layer under a same etching condition satisfies: $2<b\leq5$.

6. The method for manufacturing a semiconductor device of claim 1, wherein a thickness of the first insulating layer ranges from 3 nm to 6 nm, a thickness of the second insulating layer ranges from 10 nm to 20 nm, and a thickness of the third insulating layer ranges from 10 nm to 20 nm.

7. The method for manufacturing a semiconductor device of claim 1, wherein surfaces of the at least two insulating layers filled in the each groove over the each word line structure are flush with the surface of the semiconductor substrate.

8. The method for manufacturing a semiconductor device of claim 1, wherein surfaces of the first shallow trench isolation structures in the array region and the second shallow trench isolation structure in the peripheral region are flush with the surface of the semiconductor substrate.

* * * * *